US012692600B2

(12) United States Patent　　(10) Patent No.:　US 12,692,600 B2
　　Kim et al.　　　　　　　　　　　(45) Date of Patent:　　　Jul. 28, 2026

(54) PRECURSOR SUPPLY SYSTEM

(71) Applicant: SAMSUNG ELECTRONICS CO., LTD., Suwon-si (KR)

(72) Inventors: Kyungrim Kim, Suwon-si (KR); Youngeun Kim, Suwon-si (KR); Youngjun Kim, Suwon-si (KR); Jihoon Kim, Suwon-si (KR); Taekjung Kim, Suwon-si (KR); Dongju Chang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 387 days.

(21) Appl. No.: 18/223,606

(22) Filed: Jul. 19, 2023

(65) Prior Publication Data

US 2024/0035159 A1　　Feb. 1, 2024

(30) Foreign Application Priority Data

Jul. 28, 2022　(KR) ........................ 10-2022-0093711
Dec. 26, 2022　(KR) ........................ 10-2022-0184650

(51) Int. Cl.
　　*C23C 16/455*　　　　(2006.01)
　　*C23C 16/448*　　　　(2006.01)
(52) U.S. Cl.
　　CPC ...... *C23C 16/45561* (2013.01); *C23C 16/448* (2013.01); *C23C 16/45589* (2013.01)

(58) Field of Classification Search
None
See application file for complete search history.

(56) References Cited

U.S. PATENT DOCUMENTS

| | | | | |
|---|---|---|---|---|
| 1,148,331 | A * | 7/1915 | Olssson | ................... F28C 3/14 |
| | | | | 165/6 |
| 7,050,708 | B2 | 5/2006 | Sandhu | |
| 8,012,876 | B2 | 9/2011 | Oosterlaken | |
| 2003/0054099 | A1* | 3/2003 | Jurgensen | ............... C23C 14/22 |
| | | | | 118/726 |
| 2005/0056216 | A1 | 3/2005 | Kuse | |
| 2005/0166847 | A1 | 8/2005 | Derderian | |
| 2010/0255198 | A1* | 10/2010 | Cleary | ............... C23C 16/4402 |
| | | | | 427/255.39 |
| 2013/0269613 | A1* | 10/2013 | Sanchez | ............... C23C 14/246 |
| | | | | 118/724 |
| 2019/0177840 | A1 | 6/2019 | Eldridge et al. | |
| 2019/0186002 | A1 | 6/2019 | Musarrat et al. | |

* cited by examiner

*Primary Examiner* — Jason Berman
(74) *Attorney, Agent, or Firm* — Muir Patent Law, PLLC

(57)　　　　ABSTRACT

A precursor supply system includes a storage tank storing the precursor in a solid state; a transfer pipe connected to the storage tank to transfer the precursor in a solid state; a phase converter connected to the transfer pipe and sublimating the transported solid-state precursor into vapor; a supply pipe connected to the phase converter and transporting a precursor in a vaporous state; and a process chamber disposed adjacently to the phase converter and connected to the supply pipe.

20 Claims, 5 Drawing Sheets

P1 > P2

PRECURSOR SUPPLY SYSTEM

CROSS-REFERENCE TO RELATED APPLICATIONS

This application claims the benefit under 35 USC 119(a) of Korean Patent Application No. 10-2022-0093711, filed on Jul. 28, 2022, and Korean Patent Application No. 10-2022-0184650, filed on Dec. 26, 2022, in the Korean Intellectual Property Office, the entire disclosures of which are incorporated herein by reference for all purposes.

BACKGROUND

1. Field

Embodiments relate to a precursor supply system.

2. Description of the Related Art

As the size of memory transistors is increasingly miniaturized, the introduction of new materials having low specific resistance may be required. For example, a deposition method using a $MoO_2Cl_2$ or $MoCl_5$ precursor may be used.

SUMMARY

According to an example embodiment, a precursor supply system may include a storage tank storing the precursor in a solid state; a transfer pipe connected to the storage tank to transfer the precursor in a solid state; a phase converter connected to the transfer pipe and sublimating the transported solid-state precursor into vapor; a supply pipe connected to the phase converter and transporting a precursor in a vaporous state; and a process chamber disposed adjacently to the phase converter and connected to the supply pipe.

According to an example embodiment, a precursor supply system may include a storage tank configured to store a precursor in a solid state; a transfer pipe connected to the storage tank, the transfer pipe being configured to transfer the precursor in the solid state by a pressure difference between opposite ends of the transfer pipe; a phase converter connected to the transfer pipe, an internal pressure of the phase converter being smaller than an internal pressure of the storage tank, and the phase converter being configured to sublime the precursor from the solid state into a vaporous precursor; a supply pipe connected to the phase converter, the supply pipe being configured to transport the vaporous precursor; and a process chamber connected to the supply pipe.

BRIEF DESCRIPTION OF DRAWINGS

Features will become apparent to those of skill in the art by describing in detail exemplary embodiments with reference to the attached drawings, in which.

DETAILED DESCRIPTION

Hereinafter, example embodiments will be described with reference to the accompanying drawings.

Figure 1:
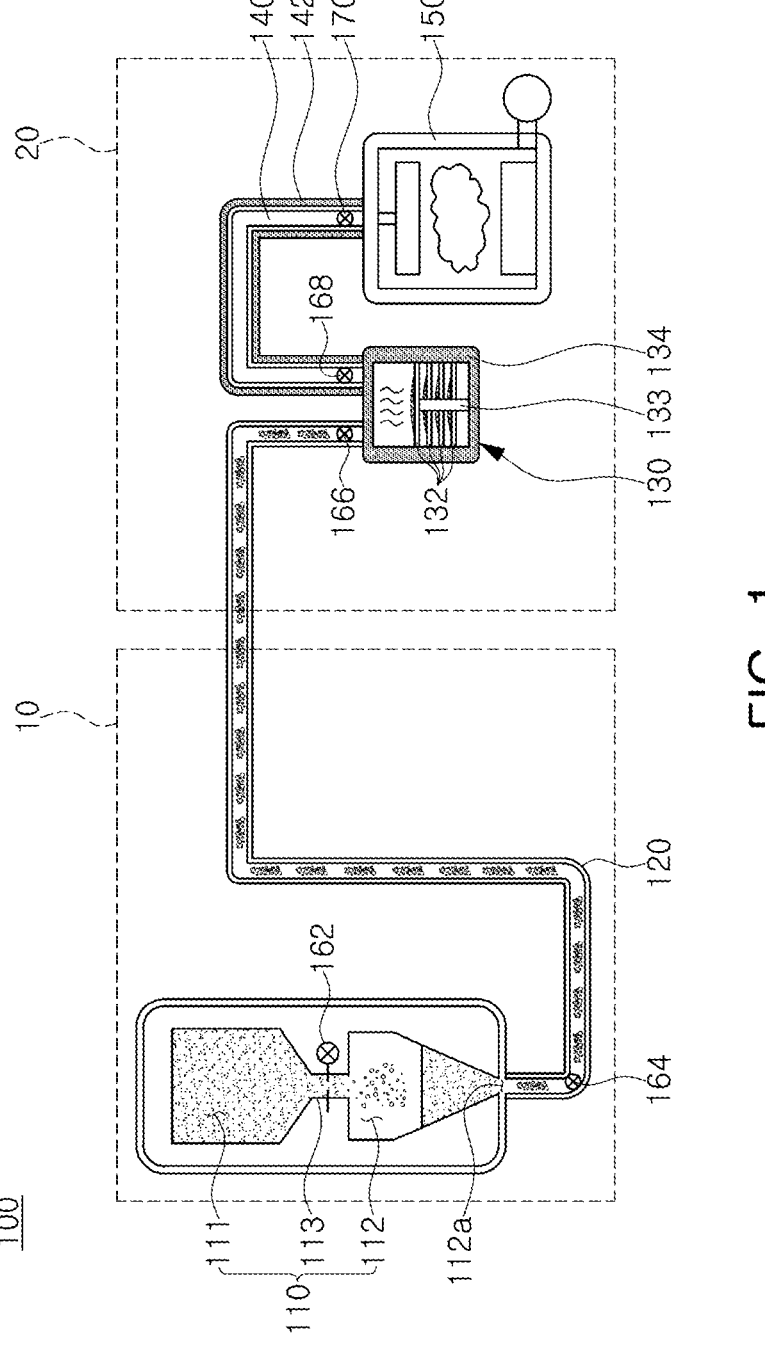
FIG. 1 is a schematic diagram illustrating a precursor supply system according to an example embodiment.
Figure 2:
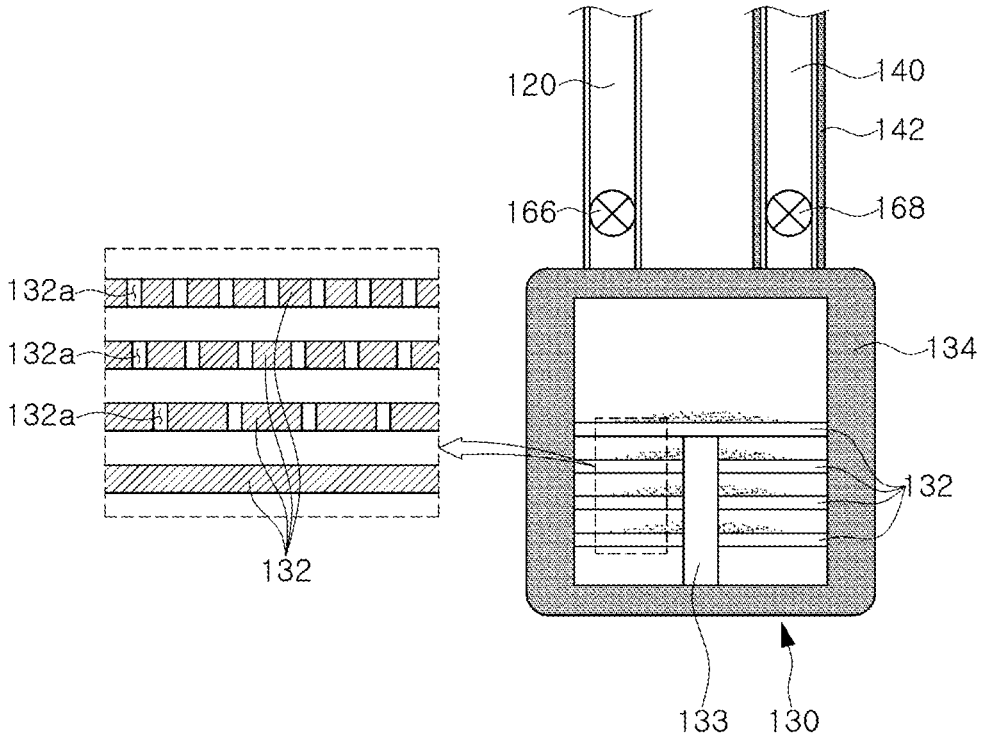
FIG. 2 is a configuration diagram illustrating a phase converter of a precursor supply system according to an example embodiment.

FIG. 1 is a schematic configuration diagram illustrating a precursor supply system according to an example embodiment. FIG. 2 is an enlarged view of a phase converter in the precursor supply system of FIG. 1.

Referring to FIG. 1, a precursor supply system 100 according to an example embodiment may include a storage tank 110, a transfer pipe 120, a phase converter 130, a supply pipe 140, and a process chamber 150.

The storage tank 110 stores a precursor in a solid state. As an example, the precursor stored in the storage tank 110 may maintain a purified solid powder state. As an example, the storage tank 110 may include a first storage space 111 for storing a precursor in powder form, and a second storage space 112 connected to the first storage space 111 and storing a precursor in powder form. A first valve 162 may be provided in a connecting portion 113 connecting the first storage space 111 and the second storage space 112. For example, the first storage space 111 may be disposed above the second storage space 112, and through the first valve 162 provided in the connecting portion 113, the inflow amount of the precursor in the form of powder flowing into the second storage space 112 may be adjusted. For example, a discharge port 112a connected to the transfer pipe 120 may be provided in the second storage space 112.

The storage tank 110 may be disposed in a sub-factory 10. As an example, the sub-factory 10 may be disposed apart from the main factory 20 (e.g., a main plant) where the process chamber 150 is disposed.

For example, the first and second storage spaces 111 and 112 of the storage tank 110 may be maintained at an environment of atmospheric pressure and room temperature. For example, the temperature and pressure of the first and second storage spaces 111 and 112 may be changed according to the type of precursor.

The transfer pipe 120 may be connected to the storage tank 110 (e.g., a reservoir) to provide a transport path for the precursor in a solid state. As an example, the transfer pipe 120 may have a first end connected to the discharge port 112a of the second storage space 112 and a second end connected to the phase converter 130. As an example, the transfer pipe 120 serves to transfer the precursor from the storage tank 110 disposed in the sub-factory 10 to the phase converter 130 disposed in the main factory 20, and the length of the transfer pipe 120, e.g., between the storage tank 110 to the phase converter 130, may be 20 m or more. For example, the transfer pipe 120, e.g., an entire length of the transfer pipe 120 between the storage tank 110 and the phase converter 130, may be maintained at same temperature and pressure as the storage tank 110, e.g., atmospheric pressure and room temperature (e.g., without a heater).

For example, the transfer pipe 120 may be disposed adjacently to the storage tank 110 and may be provided with a second valve 164 for controlling the discharge amount of the powdered precursor flowing from the storage tank 110 into the transfer pipe 120. In addition, the transfer pipe 120 may be provided with a third valve 166 disposed adjacently to the phase converter 130 for regulating the supply amount of the powdered precursor supplied to the phase converter 130 from the transfer pipe 120.

The phase converter 130 may be connected to the transfer pipe 120 and may perform sublimation of the transported solid-state precursor into vapor. In detail, the phase converter 130 may have an internal space, and may be connected between the transfer pipe 120 and the supply pipe 140.

For example, the transfer pipe 120 and the supply pipe 140 may be connected to the upper surface of the phase converter 130. As an example, the precursor in powder state supplied through the transfer pipe 120 is sublimed into a vaporous state in the phase converter 130, and the sublimed vapor precursor is supplied to the process chamber 150 through the supply pipe 140. For example, a plurality of trays 132 may be provided in the internal space of the phase converter 130, and the plurality of trays 132 may be installed on a mounting table 133 to be sequentially arranged in the upper and lower directions of the phase converter 130. For example, as illustrated in FIG. 1, the plurality of trays 132 may be stacked on top of each other in the vertical direction, e.g., along a direction normal to a bottom of the phase converter 130, and may be spaced apart from each other in the vertical direction.

For example, as illustrated in FIG. 2, each tray 132 may be provided with a plurality of through-holes 132*a* to pass the precursor. The size, number, and position of the through-holes 132*a* provided in each tray 132 may be different from each other. For example, as further illustrated in FIG. 2, the through-holes 132*a* may have a non-overlapping relationship in the vertical direction, e.g., each of the through-holes 132*a* in one tray 132 may be offset (e.g., shifted or misaligned) horizontally relative to through-holes 132*a* in an adjacent tray 132. For example, the tray 132 disposed at the bottom of the phase converter 130, e.g., a bottommost tray 132, may not have through-holes 132*a*. In this manner, since the size, number, and position of the through-holes 132*a* provided in each tray 132 are different from each other, the supplied powder precursor may be evenly spread over the plurality of trays 132.

As further illustrated in FIGS. 1 and 2, the phase converter 130 may include a main heater 134 to sublime the supplied solid-state precursor, e.g., heat the supplied solid-state precursor to a sublimation temperature. For example, as illustrated in FIG. 2, the main heater may completely surround, e.g., enclose, the phase converter 130, e.g., with the exception of the connection to the transfer pipe 120 and the supply pipe 140. Therefore, the internal space of the phase converter 130 may maintain a high-temperature and low-pressure state for sublimation of the precursor. For example, the temperature and pressure inside the phase converter 130 may be maintained at approximately 130° C. and 130 Torr.

Figure 3:
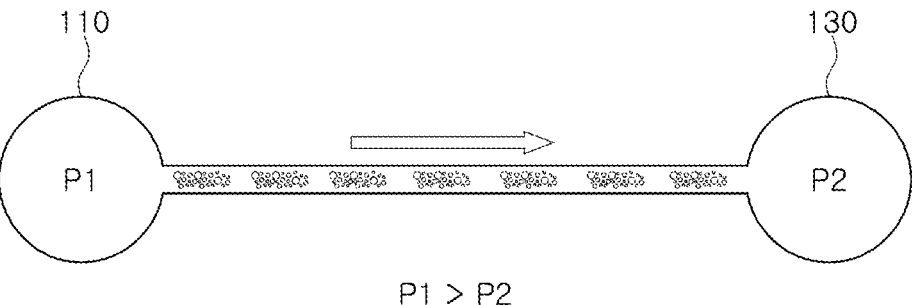
FIG. 3 is a diagram illustrating a driving force for transferring a precursor in a powder state through a transfer pipe according to an example embodiment.

For example, as illustrated in FIG. 3, the internal pressure P1 of the storage tank 110 may be greater than the internal pressure P2 of the phase converter 130, and the precursor may be transferred, e.g., pneumatically, along the transfer pipe 120 by the pressure difference (P1–P2) between the storage tank 110 and the phase converter 130, e.g., by a pressure difference between opposite ends of the transfer pipe 120. However, embodiments are not limited thereto, e.g., a pump or the like for transporting the precursor may be connected to the transfer pipe 120.

As illustrated in FIG. 1, the supply pipe 140 may be connected to the phase converter 130 and serve to transfer the vaporous precursor from the phase converter 130 to the process chamber 150. For example, as illustrated in FIG. 1, a total length of the supply pipe 140 may be shorter than a total length of the transfer pipe 120. For example, the supply pipe 140 may include (e.g., or may be connected to) a supply heater 142 in order to maintain the high-temperature state of the vaporous precursor. For example, the supply heater 142 for the supply pipe 140 may be disposed to, e.g., continuously, surround the, e.g., entire, supply pipe 140. The supply pipe 140 may further include a fourth valve 168 to control the supply amount of the vaporous precursor supplied from the phase converter 130.

Figure 4:
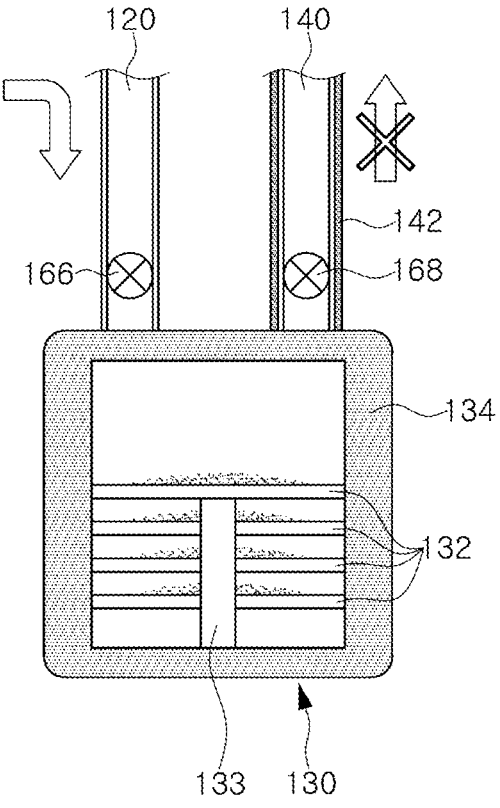
FIGS. 4 and 5 are explanatory diagrams illustrating the transfer of the precursor flowing into and out of the phase converter according to an example embodiment.
Figure 5:
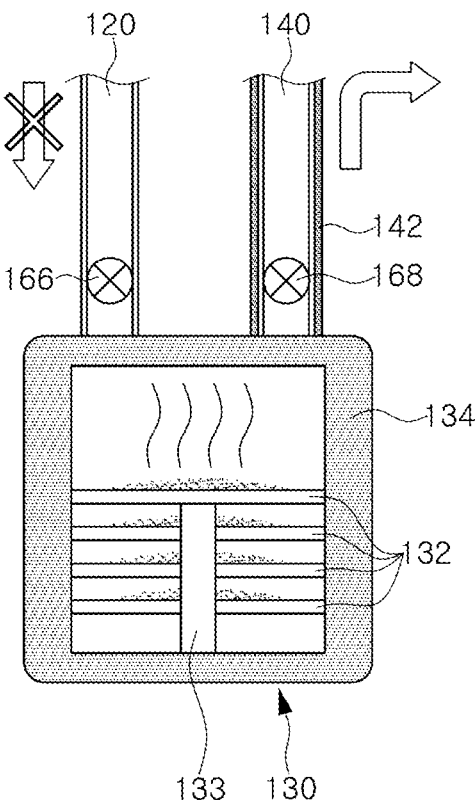

For example, the third valve 166 and the fourth valve 168 installed respectively in the transfer pipe 120 and the supply pipe 140 connected to the phase converter 130 may be operated, e.g., opened and closed, alternately. That is, as illustrated in FIG. 4, when the third valve 166 is opened and the precursor in a powder state is supplied to the phase converter 130, the fourth valve 168 is closed. And, as illustrated in FIG. 5, when the vaporous state precursor is supplied to the process chamber 150 through the supply pipe 140, the fourth valve 168 is opened and the third valve 166 is closed.

Moreover, the supply pipe 140 may be disposed adjacently to the process chamber 150 and may be provided with a fifth valve 170 for controlling the supply amount of the supplied vaporous state precursor. The temperature and pressure in the supply pipe 140 may be maintained at a same or substantially similar temperature and pressure as those of the phase converter 130. As an example, the temperature and pressure in the supply pipe 140 may be maintained at approximately 130° C. and 130 Torr so that the precursor may maintain a vaporous state.

The process chamber 150 may be connected to the phase converter 130 through the supply pipe 140. As an example, the process chamber 150 may be a chamber in which a deposition process is performed. However, it is not limited thereto, and all semiconductor manufacturing facilities using precursors may be employed. For example, the inside of the process chamber 150 may be in a vacuum state.

For example, the precursor described above may be, e.g., a $MoO_2Cl_2$ or $MoCl_5$ precursor. As described above, since the powdered precursor is transferred from the storage tank 110 to the phase converter 130 through the transfer pipe 120 in a powdered (i.e., solid) state, there is no need to maintain the transfer pipe 120 at a high temperature. Further, since the supply pipe 140 is substantially shorter than the transfer pipe 120, maintenance and uniformity of the precursor in a vaporous state in the supply pipe 140 at higher temperatures is substantially facilitated and improved.

By way of summation and review, a deposition method using a $MoO_2Cl_2$ or $MoCl_5$ precursor with low specific resistance even at a thin thickness has been considered. The $MoO_2Cl_2$ or $MoCl_5$ precursor exist in a solid state at room temperature due to low vapor pressure characteristics thereof, and to effectively store and supply the precursor in the facility, a container dedicated to solid precursors is used.

For example, in the case of mass production lines, a central supply system in which high-capacity containers are installed in sub-fabs may be introduced to shorten the precursor replacement cycle and increase supply stability. This method requires sublimating a high-temperature precursor in a container and supplying the precursor in a vaporous state, e.g., via a long pipe having a length of about 20 m to 30 m or more that is maintained a high temperature along its entire length. However, the long length of the pipe may trigger generation of cold sports or hot spots therein, thereby causing generation of particles or powder in the vapor.

In contrast, example embodiments provide a precursor supply system in which the possibility of generating particles or powder is reduced. Example embodiments also provide a precursor supply system that is easy to maintain and repair.

That is, it is possible to reduce the possibility of generating particles or powder generated during the transfer of the vaporous state precursor. In addition, since there is no need to maintain the transfer pipe at a high temperature state, maintenance and repair may be significantly facilitated.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A precursor supply system, comprising:
a storage tank configured to store a precursor in a solid state;
a transfer pipe connected to the storage tank, the transfer pipe being configured to transfer the precursor in the solid state;
a phase converter connected to the transfer pipe, the phase converter being configured to receive the precursor in the solid state from the storage tank through the transfer pipe, and being configured to sublime the precursor in the solid state from a solid state into a vaporous precursor,
a supply pipe connected to the phase converter, the supply pipe being configured to transport the vaporous precursor; and
a process chamber adjacent to the phase converter and connected to the supply pipe, the process chamber being configured to receive the vaporous precursor from the phase converter through the supply pipe.

2. The precursor supply system as claimed in claim 1, wherein the storage tank includes:
a first storage space configured to store the precursor in the solid state;
a second storage space configured to store the precursor in the solid state, the second storage space being connected to the first storage space;
a connecting portion connecting the first storage space and the second storage space; and
a first valve in the connecting portion.

3. The precursor supply system as claimed in claim 2, wherein the second storage space includes a discharge port connected to the transfer pipe.

4. The precursor supply system as claimed in claim 1, wherein the transfer pipe includes a second valve configured to control a discharge amount of the precursor in the solid state from the storage tank.

5. The precursor supply system as claimed in claim 1, wherein:
an internal pressure of the storage tank is greater than an internal pressure of the phase converter, and
the precursor in the solid state is transported through the transfer pipe by a pressure difference between the storage tank and the phase converter.

6. The precursor supply system as claimed in claim 1, wherein the phase converter includes a plurality of trays on which the precursor is seated.

7. The precursor supply system as claimed in claim 6, wherein the plurality of trays are sequentially arranged in a vertical direction of the phase converter.

8. The precursor supply system as claimed in claim 6, wherein each of the plurality of trays includes a plurality of through-holes, the through-holes in each of the plurality of trays having different sizes from each other.

9. The precursor supply system as claimed in claim 1, wherein the phase converter includes a main heater configured to heat the phase converter to a sublimation temperature.

10. The precursor supply system as claimed in claim 1, wherein the transfer pipe include a third valve configured to control a supply amount of the precursor in the solid state supplied to the phase converter.

11. The precursor supply system as claimed in claim 10, wherein the supply pipe includes a fourth valve configured to control a supply amount of the vaporous precursor supplied from the phase converter.

12. The precursor supply system as claimed in claim 11, wherein:
when the third valve is open, the fourth valve is closed, and
when the fourth valve is open, the third valve is closed.

13. The precursor supply system as claimed in claim 1, wherein a length of the transfer pipe is 20 m or more.

14. The precursor supply system as claimed in claim 13, wherein the storage tank is in a sub-factory, and the process chamber is in a main factory.

15. The precursor supply system as claimed in claim 1, wherein the supply pipe includes a supply heater.

16. The precursor supply system as claimed in claim 1, wherein the transfer pipe is maintained at a same temperature and pressure as the storage tank.

17. The precursor supply system as claimed in claim 16, wherein the supply pipe includes a supply heater, the supply pipe being maintained at a same temperature and pressure as the phase converter.

18. A precursor supply system, comprising:
a storage tank configured to store a precursor in a solid state;
a transfer pipe connected to the storage tank, the transfer pipe being configured to transfer the precursor in the solid state by a pressure difference between opposite ends of the transfer pipe;
a phase converter connected to the transfer pipe, an internal pressure of the phase converter being smaller than an internal pressure of the storage tank, and the phase converter being configured to receive the precursor in the solid state from the storage tank through the transfer pipe, and being configured to sublime the precursor in the solid state from a solid state into a vaporous precursor;
a supply pipe connected to the phase converter, the supply pipe being configured to transport the vaporous precursor; and
a process chamber connected to the supply pipe, the process chamber being configured to receive the vaporous precursor from the phase converter through the supply pipe.

19. The precursor supply system as claimed in claim 18, wherein the storage tank includes:
a first storage space configured to store the precursor in the solid state;
a second storage space configured to store the precursor in the solid state, the second storage space being connected to the first storage space;

a connecting portion connecting the first storage space and the second storage space; and a first valve in the connecting portion.

20. The precursor supply system as claimed in claim 18, wherein the transfer pipe includes a second valve configured to control a discharge amount of the precursor in the solid state from the storage tank.

* * * * *